(12) United States Patent
Takase et al.

(10) Patent No.: US 9,415,469 B2
(45) Date of Patent: Aug. 16, 2016

(54) RESIN COMPOSITION FOR SOLDER BUMP FORMATION, SOLDER BUMP FORMATION METHOD, AND MEMBER HAVING SOLDER BUMPS

(71) Applicant: SAN-EI KAGAKU CO., LTD., Tokyo (JP)

(72) Inventors: Yasuhiro Takase, Saitama (JP); Kazuki Hanada, Saitama (JP); Kazunori Kitamura, Saitama (JP)

(73) Assignee: SAN-EI KAGAKU CO., LTD., Tokyo (JP)

( * ) Notice: Subject to any disclaimer, the term of this patent is extended or adjusted under 35 U.S.C. 154(b) by 0 days.

(21) Appl. No.: 14/340,850

(22) Filed: Jul. 25, 2014

(65) Prior Publication Data

US 2015/0027768 A1   Jan. 29, 2015

(30) Foreign Application Priority Data

Jul. 25, 2013 (JP) .................................. 2013-154949
Apr. 25, 2014 (JP) .................................. 2014-102808

(51) Int. Cl.
| | |
|---|---|
| B23K 35/36 | (2006.01) |
| H05K 1/09 | (2006.01) |
| B23K 35/02 | (2006.01) |
| B23K 1/20 | (2006.01) |
| B23K 1/00 | (2006.01) |
| B23K 3/06 | (2006.01) |
| B23K 3/08 | (2006.01) |
| H05K 3/34 | (2006.01) |

(52) U.S. Cl.
CPC ........... B23K 35/3613 (2013.01); B23K 1/0016 (2013.01); B23K 1/20 (2013.01); B23K 3/0638 (2013.01); B23K 3/08 (2013.01); B23K 35/025 (2013.01); B23K 35/0222 (2013.01); B23K 35/0244 (2013.01); B23K 35/3612 (2013.01); H05K 3/3484 (2013.01); B23K 2201/42 (2013.01); H01L 2224/11 (2013.01); H05K 2203/0139 (2013.01); H05K 2203/043 (2013.01); H05K 2203/0425 (2013.01); H05K 2203/0445 (2013.01); H05K 2203/0588 (2013.01); H05K 2203/0769 (2013.01); H05K 2203/0773 (2013.01); H05K 2203/111 (2013.01)

(58) Field of Classification Search
None
See application file for complete search history.

(56) References Cited

U.S. PATENT DOCUMENTS

| | | | | |
|---|---|---|---|---|
| 5,863,355 | A | * | 1/1999 | Ohno ................. B23K 35/3613 106/1.13 |
| 2008/0053572 | A1 | | 3/2008 | Sanji et al. |
| 2011/0233768 | A1 | * | 9/2011 | Kawashiro ........ H01L 23/49816 257/737 |

FOREIGN PATENT DOCUMENTS

| | | |
|---|---|---|
| JP | 2000-208911 | 7/2000 |
| JP | 2010-137283 | 6/2010 |
| JP | 2012-4347 | 1/2012 |

OTHER PUBLICATIONS

TW Office Action, dated Aug. 20, 2015; Application No. 103124886.
KR Office Action, dated Dec. 30, 2015, in corresponding Korean Patent Application.

* cited by examiner

*Primary Examiner* — Asok K Sarkar
(74) *Attorney, Agent, or Firm* — Young & Thompson

(57) ABSTRACT

The present invention provides a solder bump formation resin composition which ensures resist (e.g., dry film) removability and which exhibits excellent solder bonding performance, even when the working substrate is placed at high temperature during reflowing, baking, or a similar process. The solder bump formation resin composition contains (A) at least one species selected from among an alkali-dissoluble thermoplastic resin having an acid value (mgKOH/g) of 110 or higher, an unsaturated fatty acid polymer having an acid value of 80 or higher, and an unsaturated fatty acid-aliphatic unsaturated compound copolymer having an acid value of 50 or higher; (B) a solvent; and (C) a solder powder, and contains no activating agent.

3 Claims, 6 Drawing Sheets

RESIN COMPOSITION FOR SOLDER BUMP FORMATION, SOLDER BUMP FORMATION METHOD, AND MEMBER HAVING SOLDER BUMPS

The entire disclosure of Japanese Patent Applications No. 2013-154949 filed on Jul. 25, 2013 and No. 2014-102808 filed on Apr. 25, 2014 is expressly incorporated by reference herein.

BACKGROUND OF THE INVENTION

1. Field of the Invention

The present invention relates to a composition for forming solder bumps on a pad of a member (e.g., a wiring board, an electronic part, or the like) (hereinafter, the composition is referred to as a "solder bump formation resin composition"), to a solder bump formation method employing the composition, and to a member having solder bumps.

2. Background Art

Generally, various electronic parts (e.g., LSIs and WLPs (wafer level packages)) employed in semiconductor devices and the like are mounted on printed wiring boards though soldering. In one method for mounting such parts on a printed wiring board in a flip-chip manner, a solder paste is printed on pads of a substrate on which devices are to be mounted, and the substrate is subjected to reflowing and washing, to thereby form solder bumps on the pads. The solder bumps formed on the substrate are brought into contact with the solder bumps formed on the device, and the substrate and device are heated to join to each other, to thereby complete solder bonding of the device.

Meanwhile, in a recent years' trend for increasing packaging density of such devices, a micro-wiring pattern is demanded, and electrode pads have become smaller. Thus, solder bumps formed through a conventional dip soldering technique or solder paste printing technique cause problems such as variation in solder amount resulting in mounting failures, and formation of a solder bridge between adjacent electrodes.

Instead of such a conventional dip soldering technique or solder paste printing technique, Patent Document 1 proposes a solder bonding method employing a dry film. This method employs a solder paste containing rosin and an activating agent.

However, when the above method is employed, the dry film is heated to high temperature during formation of solder bumps through reflowing or baking. As a result, residues of the dry film remain in the vicinity of the solder bumps, which is problematic.

Patent Document 1: Japanese Patent Application Laid-Open (kokai) No. 2000-208911

SUMMARY OF THE INVENTION

The present invention has been conceived under such circumstances. Thus, an object of the present invention is to provide a solder bump formation resin composition which ensures resist (e.g., dry film) removability and which exhibits excellent solder bonding performance, even when the working substrate is placed at high temperature during reflowing, baking, or a similar process. Another object is to provide a solder bump formation resin composition which exhibits the above basic properties and which does not leave a resin residue on bumps and does not cause solder subducting.

Furthermore, an object of the present invention is to provide a solder bump formation method employing the solder bump formation resin composition. Still another object is to provide a member having a bump formed through the solder bump formation method.

The present inventors have carried out extensive studies so as to attain the above objects, and have considered that a dry film residue remains on bumps through the following conceivable mechanism. That is, when a conventional solder paste containing an activating agent (e.g., a hydrogen halide, an organic acid (e.g., adipic acid), an organic amine (e.g., diethylamine), or a hydrogen halide-organic amine salt) is used, the activating agent undergoes addition reaction to double bonds remaining in the dry film, when the working substrate is placed at high temperature during reflowing or baking for forming solder bumps. Thus, the alkali solubility of the dry film decreases, to thereby provide dry film residues.

The inventors have found that, when a thermoplastic resin which has an acidic group and which can be dissolved in an alkali medium is used instead of an activating agent, dry film removability can be maintained, and the acidic group can remove oxide film formed on solder, whereby solder bumps exhibiting excellent solder bonding performance can be formed without use of an activating agent. The inventors have also found that the thermoplastic resin is remarkably less corrosive to wiring boards and electronic parts. The present invention has been accomplished on the basis of these findings.

Accordingly, in one mode of the present invention, there is provided a solder bump formation resin composition comprising:

(A) at least one species selected from among an alkali-dissoluble thermoplastic resin having an acid value (mgKOH/g) of 110 or higher, an unsaturated fatty acid polymer having an acid value of 80 or higher, and an unsaturated fatty acid-aliphatic unsaturated compound copolymer having an acid value of 50 or higher;

(B) a solvent; and (C) a solder powder, and containing no activating agent.

In the solder bump formation resin composition of the first mode, the component (A) is at least one species selected from among an unsaturated fatty acid polymer having an acid value of 80 to 110, a monobasic unsaturated fatty acid-aromatic unsaturated compound copolymer having an acid value of 110 to 220, a dibasic unsaturated fatty acid-aromatic unsaturated compound copolymer having an acid value of 200 to 215, and a rosin-modified resin having an acid value of 140 to 220.

In a second mode of the present invention, there is provided a solder bump formation method which comprises: placing a resist layer provided with an opening on a member having a pad such that the pad is exposed to the opening; filling the opening with a solder bump formation resin composition as recited in the first mode; removing the component (B); melting the component (C) by heating; and removing the resist layer and the component (A).

The solder bump formation resin composition may be used in the solder bump formation method.

In a third mode of the present invention, there is provided a member having a solder bump formed through the solder bump formation method.

The present invention enables provision of a solder bump formation resin composition which ensures resist (e.g., dry film) removability and which exhibits excellent solder bonding performance, even when the working substrate is placed at high temperature during reflowing, baking, or a similar process, and also a solder bump formation resin composition which exhibits the above basic properties and which does not leave a resin residue on bumps and does not cause solder subducting.

The present invention enables provision of the solder bump formation method employing such a solder bump formation resin composition, and a member having a bump formed through the solder bump formation method.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1A:
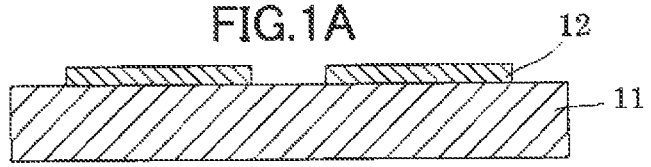
FIGS. 1A to 1G show an example of the method for producing a solder-mounted board.

A best embodiment of the solder bump formation method of the present invention will next be described in detail, with reference to FIG. 1.

A characteristic feature of the solder bump formation resin composition of the present invention resides in that the composition contains (A) at least one species selected from among an alkali-dissoluble thermoplastic resin having an acid value (mgKOH/g) of 110 or higher, an unsaturated fatty acid polymer having an acid value of 80 or higher, and an unsaturated fatty acid-aliphatic unsaturated compound copolymer having an acid value of 50 or higher; (B) a solvent; and (C) a solder powder, and contains no activating agent.

In the solder bump formation resin composition according to the present invention, one example of the alkali-dissoluble thermoplastic resin (A) is a thermoplastic resin which is soluble in an alkali developer and which has an acidic group, specifically, one or more groups selected from a carboxyl group, a sulfonic group, a phosphoric group, etc. Examples of the alkali developer include a weak alkali developer (e.g., aqueous sodium carbonate) and a strong alkali developer (e.g., aqueous tetramethylammonium hydroxide).

Specific examples of the component (A) include polymers prepared from polymerizable monomers including an unsaturated fatty acid. Examples of the unsaturated fatty acid include monobasic unsaturated fatty acids (more specifically, (meth)acrylic acid (i.e., acrylic acid and/or methacrylic acid, (herein after acrylic acid and/or methacrylic acid; and acrylylate and/or methacrylate may be referred to as a (meth) acrylic acid and (meth)acrylate, respectively), crotonic acid, and the like) and polybasic unsaturated fatty acids (more specifically, dibasic unsaturated fatty acids (e.g., maleic acid, fumaric acid, anhydrides thereof, and the like). In the present invention, one or more such unsaturated fatty acids may be used.

The component (A) may have an aromatic ring or no aromatic ring. Examples of the component (A) having no aromatic ring include polymers prepared exclusively from one or more unsaturated fatty acids (hereinafter may be referred to as an "unsaturated fatty acid polymer"), and copolymers prepared from an unsaturated fatty acid and another aliphatic unsaturated compound (e.g., an alkyl (meth)acrylate ester) (hereinafter may be referred to as an "unsaturated fatty acid-aliphatic unsaturated compound copolymer"). Specific examples of the unsaturated fatty acid polymer include (meth)acrylic acid resins. In the present invention, one or more such unsaturated fatty acid polymers may be used. Examples of the unsaturated fatty acid-aliphatic unsaturated compound copolymer include (meth)acrylic acid-ethyl (meth)acrylate copolymer resins. In the present invention, one or more such unsaturated fatty acid-aliphatic unsaturated compound copolymers may be used.

Examples of the component (A) having an aromatic ring include copolymers prepared from an unsaturated fatty acid and an aromatic unsaturated compound. Specific examples of the aromatic unsaturated compound include styrenes (styrene and α-methylstyrene etc.). In the present invention, one or more such copolymers may be used. Specific examples of the copolymer having the aromatic ring include copolymers of a monobasic unsaturated fatty acid or a dibasic unsaturated fatty acid with an aromatic unsaturated compound (hereinafter may be referred to as a "monobasic unsaturated fatty acid-aromatic unsaturated compound copolymer" or a "dibasic unsaturated fatty acid-aromatic unsaturated compound copolymer"). Specific examples of the monobasic unsaturated fatty acid-aromatic unsaturated compound copolymer include acrylic acid-styrene copolymer resins. In the present invention, one or more such copolymer resins may be used. Examples of the dibasic unsaturated fatty acid-aromatic unsaturated compound copolymer include maleic acid-styrene copolymer resins. In the present invention, one or more such copolymers may be used.

The component (A) may be a rosin-modified resin. Examples of the rosin-modified resin include resins treated with an unsaturated fatty acid and hydrogenated resins. Specific examples of the rosin-modified resin include a rosin-modified maleic acid resin, a rosin-modified phenolic resin, and a rosin POE ester product. The rosin-modified maleic acid resin is prepared through adding a dibasic unsaturated fatty acid to rosin, adding a polyhydric alcohol thereto, and carrying out esterification at high temperature. The rosin-modified phenolic resin is prepared by adding a resol-type phenol-formaldehyde resin to rosin and esterifying with a polyhydric alcohol. The rosin POE ester product is prepared by heating rosin and EO (ethylene oxide) at high temperature in the presence of an alkali catalyst, to thereby yield a monoester.

In the present invention, one or more species of the above modified resins may be used as the component (A).

The alkali-dissoluble thermoplastic resin serving as the component (A) has an acid value (mgKOH/g) of 110 or higher. The unsaturated fatty acid polymer also serving as the component (A) has an acid value of 80 or higher, and the unsaturated fatty acid-aliphatic unsaturated compound copolymer also serving as the component (A) has an acid value of 50 or higher. When the acid value is excessively low, the resist layer cannot be removed completely, and a residue of the resist layer may remain after removal. That is, resist removability may be impaired. In addition, the function of the activating agent (e.g., solder bonding performance of solder bumps) may be insufficient. Also, the component (A) preferably has an acid value of 250 or less, particularly 220 or less. When the acid value is excessively high, corrosion may occur, particularly under high-moisture conditions. In other words, corrosion resistance may lower.

More preferably, the acid value of the unsaturated fatty acid polymer is 80 to 115, particularly preferably 80 to 110, yet more preferably 85 to 105. The acid value of the unsaturated fatty acid-aliphatic unsaturated compound copolymer is more preferably 50 to 100, particularly preferably 65 to 85, yet more preferably 70 to 80. The acid value of the monobasic unsaturated fatty acid-aromatic unsaturated compound copolymer is more preferably 110 to 230, particularly preferably 110 to 220, yet more preferably 130 to 200. The acid value of the dibasic unsaturated fatty acid-aromatic unsaturated compound copolymer is more preferably 190 to 220, particularly preferably 200 to 215, yet more preferably 205 to 215. The acid value of the rosin-modified resin is more preferably 130 to 250, particularly preferably 140 to 220, yet more preferably 150 to 200. When the acid value is excessively low, a residue of the component (A) may remain on the formed solder bumps. That is, resin removability may be impaired. In contrast, when the acid value is excessively high, peeling of the resist layer occurs during formation of solder bumps through reflowing or baking. In this case, solder subducting; i.e., entry of solder into the space under the resist layer, tends to occur.

The component (A) is preferably a solid at ambient temperature. Particularly, the softening point is preferably 50° C. or higher. When the softening point is excessively low, the resin composition may be sticky after removal of solvent; in this case, handling may be impeded, and foreign matters may deposit thereon.

Preferably, the component (A) has a softening point of 150° C. or lower, particularly preferably 130° C. or lower, yet more preferably 100° C. or lower. When the softening point is excessively high, the solder powder (C) has excessively high melt viscosity during the below-mentioned heat melting process thereof. In this case, thermal unification of solder microparticles may be impeded. That is, microparticle unification performance may lower.

The component (A) is preferably has a weight average molecular weight of 15,000 or lower, particularly preferably 1,000 to 10,000. When the weight average molecular weight exceeds 15,000, the viscosity of the solder bump formation resin composition rises excessively, whereby difficulty is encountered in filling the opening with the resin composition as described hereinbelow. That is, filling performance may lower.

In the solder bump formation resin composition according to the present invention, the solvent (B) dissolves the component (A). As described hereinbelow, after charging the solder bump formation resin composition into openings with leveling by means of a spatula or the like, the component (B) is removed or dried by, for example, heating. Thus, the charged material decreases in volume corresponding to that of the component (B). As a result, the height of the charged material becomes lower than that of the resist layer. Thus, formation of a solder bridge between adjacent electrodes can be prevented in the formation of solder bumps with very small pitches.

Examples of the component (B) include solvents having a boiling point of 150 to 250° C. From the viewpoints of impacts on health and natural environment, diglycol ether solvents are preferred. Specific examples thereof include diethylene glycol monoethyl ether, diethylene glycol monobutyl ether, diethylene glycol monoethyl ether acetate, diethylene glycol monobutyl ether acetate, dipropylene glycol monomethyl ether, dipropylene glycol monoethyl ether, dipropylene glycol monobutyl ether, dipropylene glycol monomethyl ether acetate, dipropylene glycol monoethyl ether acetate, and dipropylene glycol monobutyl ether acetate. These solvent may be used singly or in combination of two or more species.

The solder powder (C) contained in the solder bump formation resin composition of the present invention is preferably, for example, a microparticulate solder containing tin (Sn) in an amount of 90 wt. % or more (particularly 95 wt. % or more), or a microparticulate solder containing bismuth (Bi) in an amount of 50 wt. % or more (particularly 55 wt. % or more). The solder powder may include other metals (e.g., copper and silver), but a lead-free solder is preferred.

The mean particle size (D50) of the solder microparticles is preferably 10 μm or less (maximum particle size: 20 μm or less), particularly preferably 5 μm or less (maximum particle size: 10 μm or less). The mean particle size and maximum particle size are determined through a laser diffraction method (JIS Z8825-1).

The solder bump formation resin composition of the present invention may further contain, as an additive, a defoaming agent, a leveling agent, a viscosity-modifying agent, or the like.

The solder bump formation resin composition of the present invention contains no activating agent. Preferably, the composition contain no rosin. In the case where an activating agent or rosin is present in the composition, resist removability may decrease. Also, when remaining on a wiring board or an electronic part, such an activating agent or rosin may cause corrosion.

Preferably, the solder bump formation resin composition of the present invention contains the components (A) to (C) at the following compositional proportions (by mass): component (A)/component (B)=20/80 to 80/20, and [component (A)+component (B)]/component (C)=5/95 to 30/70. The component (C) content is preferably 80 wt. % or higher, particularly preferably 90 wt. % or higher, yet more preferably 95 wt. % or higher.

The solder bump formation resin composition of the present invention preferably has a viscosity (Pa·s) of 10 to 1,000, particularly preferably 50 to 800, yet more preferably 100 to 500. The viscosity is determined through the method of JIS K7717-2. When the viscosity is excessively low, the resin composition which has been charged in openings may flow out from the openings, whereas when the viscosity is excessively high, difficulty may be encountered in filling the openings with the resin composition, or the filling material may cause problems such as deposition of foreign matter and poor handling property, due to stickiness of the material.

Next, the best mode of the solder bump formation method according to the present invention will be described in detail, with reference to FIGS. 1A to 1G.

In the solder bump formation method of the present invention, a resist layer provided with an opening is placed on a member having a pad such that the pad is exposed to the opening; the opening is filled with the aforementioned solder bump formation resin composition; the component (B) is removed; the component (C) is melted by heating; and the resist layer and the component (A) are removed.

In the solder bump formation method of the present invention, firstly, a resist layer provided with an opening is placed on a member having a pad such that the pad is exposed to the opening.

The resist layer is formed of any material which can be removed from the member in a subsequent step through solvent removal, peeling, or the like. The material is, for example, a material which can be removed with an alkali developer; e.g., a reflow resist. The resist layer has a thickness of, for example, 30 to 300 μm. When the thickness of the resist layer is excessively small, solder bridge may form, whereas when the thickness is excessively large, air in the opening cannot be completely discharged, whereby the charging density of the solder bump formation resin composition may vary.

The member may be any object such as a part or an article, so long as the object has a pad. Typical examples thereof include parts such as a wiring board and an electronic part.

Examples of the pad include an electrode pad. In the present invention, at least a part of the surface area of the pad may be exposed to the opening.

The resist layer provided with an opening may be placed on the member through exposure and development of the resist material via a negative mask. More specifically, an active energy beam-curable resin layer is stacked on the member having pads. Then, a negative mask having such a pattern that the pad is correctly masked is placed on the resin layer, and the entire surface of the stacked resin layer is irradiated with an active energy beam, to thereby cure the resin layer. An unexposed portion of the stacked resist layer (i.e., a portion of the resin layer on the pad) is removed with an alkali developer. Thus, a cured resist layer is formed on the member in such a manner that the pad is exposed to the opening.

Examples of the active energy beam include light (e.g., UV).

Figure 1B:
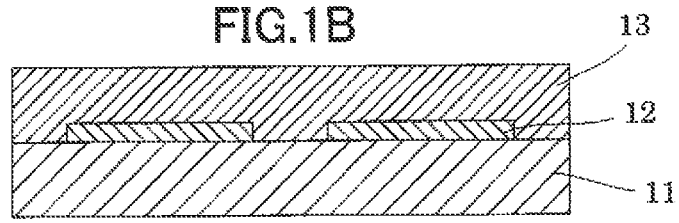

A more specific procedure will be described. As shown in FIG. 1A, a wiring board (or an electronic part; hereinafter referred to as a "wiring board") 11 is provided. The wiring board 11 has electrode pads 12. As shown in FIG. 1B, an active energy beam-curable resin layer 13 is placed to cover the electrode pads 12 on the wiring board 11. The covering resin layer 13 may be formed through, for example, stacking an active energy beam-curable dry film on the wiring board 11, or applying an active energy beam-curable resin ink onto the wiring board 11.

Figure 1C:
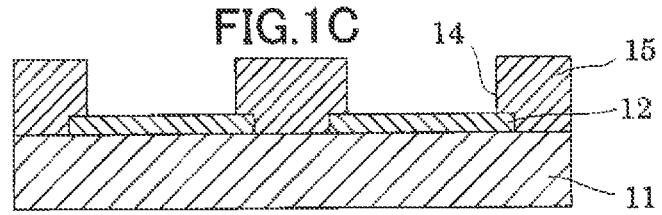

Then, as shown in FIG. 1C, the entire surface of the covering resin layer 13 is irradiated with an active energy beam via a negative mask (not illustrated), to thereby cure the resin. The unexposed portion of the resin layer is removed with, for example, a weak alkaline solution (aqueous sodium carbonate). Thus, a cured resist layer 15 having openings 14 to which respective electrode pads 12 are exposed is formed on the wiring board 11.

Alternatively, the above light exposure and development may be performed by the mediation of a positive mask. Specifically, an active energy beam-dissoluble resin layer is stacked on a member having pads. The entire surface of the stacked resin layer is irradiated with an active energy beam via a positive mask having such a pattern that areas corresponding to the pads are optically transparent. Then, the exposed portion (i.e., portions of the stacked resin layer on the pads) is removed with an alkali developer. Thus, a resist layer having openings to which respective pads are exposed is formed on the member.

In a further alternative method for providing a resist layer having openings, firstly, a resist layer is stacked on the member so as to cover electrode pads 12 of the wiring board 11, in a manner similar to that shown in FIG. 1B. The resist layer may have no curability. The portions of the resist layer corresponding to the pads are processed through, for example, irradiation with a laser beam or drilling, to thereby provide openings. Thus, a resist layer having openings through which respective pads are exposed is formed on the member.

In a yet another alternative method for providing a resist layer having openings, firstly, the resist film is pierced in advance to provide openings on the pads. The resist film may have no curability. Then, the resist film is positioned such that the openings are placed just on the pads, and is attached to the member (e.g., affixing). Thus, a resist layer having openings through which respective pads are exposed is formed on the member.

Figure 1D:
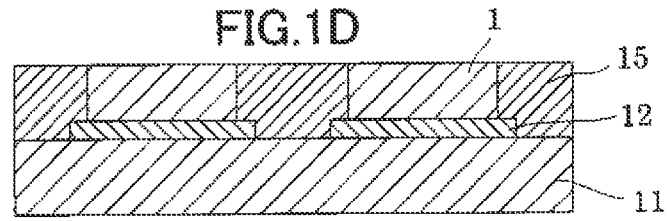

Subsequently, the solder bump formation resin composition of the present invention is charged into the openings. As shown in FIG. 1D, in one procedure, the solder bump formation resin composition 1 of the present invention is charged into the openings 14 of the cured resist layer 15 preferably with leveling by means of a spatula or the like.

Figure 1E:
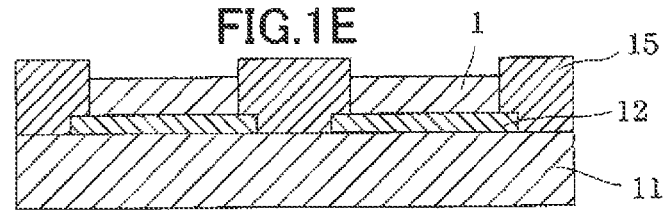

Then, the component (B) (of the charged resin composition 1) is removed. As shown in FIG. 1E, in one procedure, the solder bump formation resin composition 1 is dried to thereby remove the solvent. In one drying mode, drying is performed at 80 to 150° C. for 10 to 120 minutes. Through drying, the volume of the resin composition charged into the openings 14 is reduced.

Figure 1F:
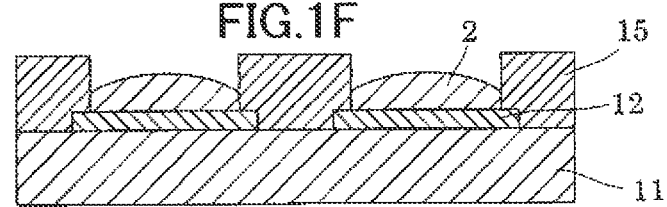
Figure 1G:
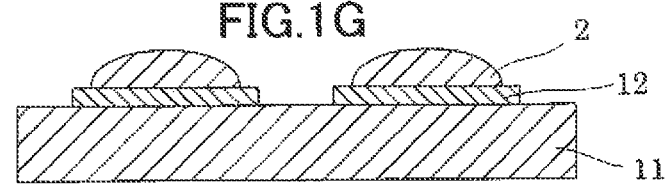

Then, the component (C) (of the charged resin composition) is melted by heating [FIG. 1F]. Heating may be performed at 180 to 300° C. for 0.1 to 1 minute. Thereafter, the molten product is cooled to solidify, to thereby form solder bumps.

Subsequently, the resist layer and the component (A) (of the charged resin composition) are removed. Since the component (A) has a specific weight smaller than that of the solder powder, the component (A) is generally deposited on solder bumps. The resist layer and the component (A) may be removed simultaneously or successively (in any order). For example, through immersion in a strong alkaline solution (e.g., aqueous tetramethylammonium hydroxide) or a similar technique, the cured resist layer 15 and the component (A) are simultaneously removed from the wiring board 11 and the solder bumps 2 [FIG. 1G]. Thus, a member (a wiring board 11) having solder bumps 2 on respective electrode pads 12 is produced.

EXAMPLES

The present invention will next be described in detail by way of examples.

<Preparation of Solder Bump Formation Resin Compositions>

Examples 1 to 18, and Comparative Examples 1 to 5 Solder bump formation resin compositions of Examples 1 to 18 and Comparative Examples 1 to 5 were prepared. Tables 1 and 2 shows the formulations of the resin compositions.

<Production of Wiring Boards Having Solder Bumps>

A copper-clad laminated board was washed with dilute sulfuric acid and then with water, followed by drying, to thereby provide a wiring board. On the wiring board, a dry film (UV-curable resin layer, product of Hitachi Chemical Co., Ltd., "HM4035," film thickness: 40 μm) was stacked.

Figure 2:
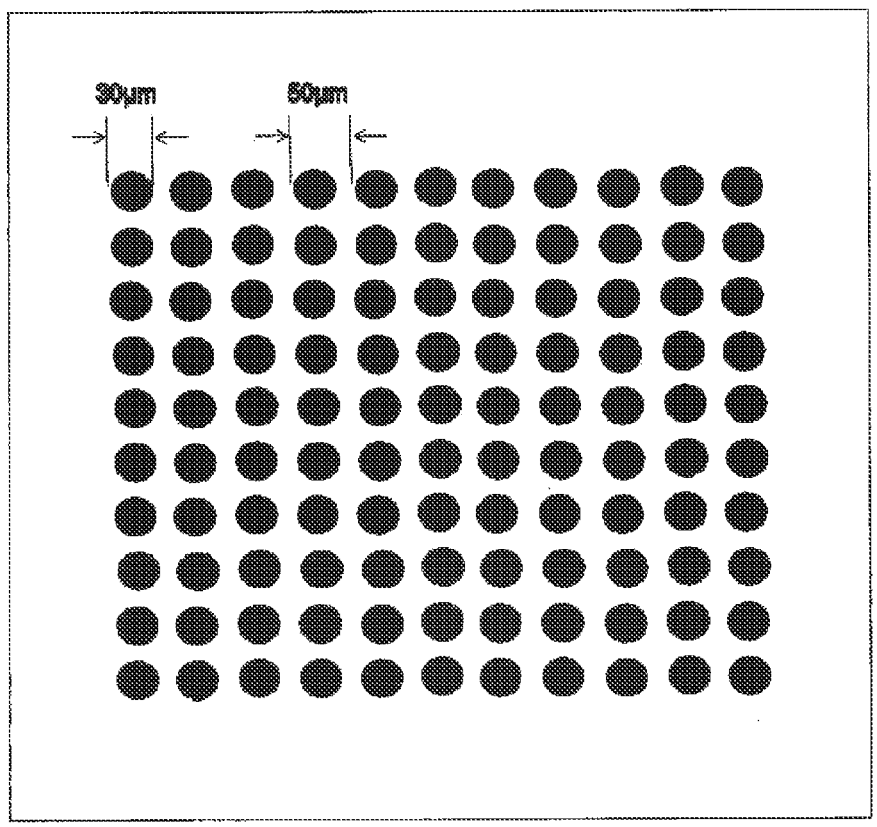
FIG. 2 shows an example the negative mask employed in the method for producing a solder-mounted board.

Then, a negative mask having a mask pattern (black dot (light-shading portions) size: 30 μm, pitch: 50 μm, number of black dots: 110) shown in FIG. 2 was placed on the dry film. The entire surface of the dry film was irradiated with UV light (100 mJ/cm$^2$) by means of an exposure apparatus (product of ORC Manufacturing Co., Ltd., "EXM-1021"). Thereafter, the negative mask was removed.

To the thus-treated wiring board, a weak alkali developer (1 wt. % aqueous sodium carbonate) was sprayed for 60 seconds. Through this development step, the unexposed portion of the dry film was removed. Thus, a resist layer was formed on the wiring board, the resist layer having openings through which the copper foil layer of the copper-clad board corresponding to pads were exposed.

Subsequently, the openings were filled with each of the solder bump formation resin compositions of Examples 1 to 18 and Comparative Examples 1 to 5, with leveling by means of a squeegee.

The thus-treated wiring board was heated at 100° C. for 60 minutes, to thereby dry out the solvent. Thereafter, the volume of the material charged in each opening decreased, whereby the height of the material was lower than that of the resist layer surrounding the openings.

Figure 3:
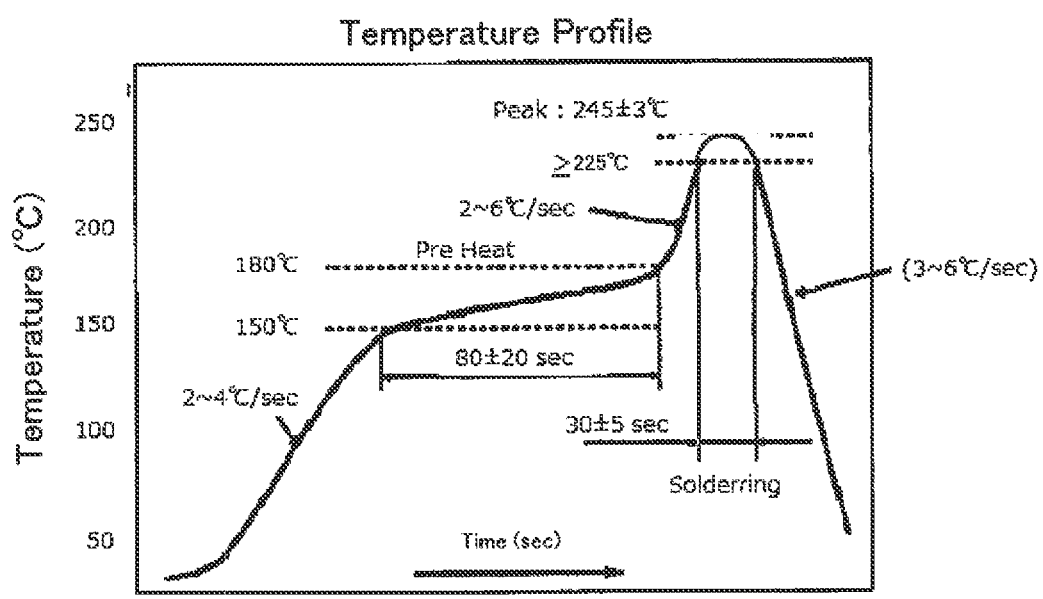
FIG. 3 is a graph showing a reflow temperature profile in the method for producing a solder-mounted board.

The wiring board was processed by means of a reflowing apparatus (product of MALCOM Co., Ltd., "RDT-250C") under the conditions specified in FIG. 3, to thereby form solder bumps.

Subsequently, the wiring board was immersed in a strong alkali developer (5 wt. % aqueous tetramethylammonium hydroxide) at 50° C. for 10 minutes, to thereby remove the resist layer and the resin component contained in the solder bump formation resin composition. Thus, a wiring board having solder bumps was produced.

<Performance Evaluation Tests>

Various performances in relation to the produced formation resin compositions and the formed solder bumps were evaluated with the following three grades of ratings. Tables 1 and 2 shows the results.

(Resist Removability)

After removal of dry film, the surface of a wiring board was visually observed so as to assess dry film removability. The observation was carried out in the dark employing a black light.

"○": No removal residue
"Δ": Trace residue remaining around openings
"X": Large amount residue remaining around openings (Solder Bonding Performance)

A cross-section of each bump was visually observed under a microscope (×20), to thereby assess solder bonding performance.

"○": All the solder balls were uniform
"Δ": Parts of the solder balls were not uniform
"X": Solder not melted (Resin Removability)

The surface of a bump was visually observed so as to assess resin component (A) removability. The observation was carried out in the dark employing a black light.

"○": No resin removal residue on the solder surface
"Δ": Trace residue remaining on the solder surface
"X": Residue remaining on the entire solder surface (Solder Subducting Inhibition)

The presence of solder subducting at portions covered with dry film was visually checked.

"○": No solder subducting
"Δ": Slight solder subducting
"X": Considerable solder subducting (Handling)

Handling property of each resin composition was assessed by the viscosity thereof (Pa·s) by means of a rotary viscometer (product of Toki Sangyo Co., Ltd., "RE-215U").

"○": 100 to 500
"Δ": 10 to 100, or 500 to 1,000
"X": <10, or >1,000

(Unification of Microparticles)

Microparticle unification property was assessed through visually observing the surface of a bump under a microscope (×20).

"○": Solder microparticles melted, to provide a uniformly protruding solder bump surface
"Δ": Parts of solder microparticles not melted, to provide a non-uniformly protruding solder bump surface
"X": Many solder microparticles not melted, to provide a rough solder bump surface (Chargeability)

A glass plate having a thickness of 3 mm was used instead of a copper-clad laminate board. After leveling the charged material, an opening in the glass plate was visually observed under a magnifying glass (×10).

"○": No bubble remaining on the glass plate serving as the bottom of the opening
"Δ": Bubbles having a size of 10 μm or less (⅓ or less the diameter of the opening) remaining on the glass plate serving as the bottom of the opening
"X": Bubbles having a size of 15 μm or more (½ or more the diameter of the opening) remaining on the glass plate serving as the bottom of the opening (Corrosion Resistance)

After formation of solder bumps, a wiring board was allowed to stand for 24 hours at 85° C. and 85% RH, without removing dry film and the thermoplastic resin component originating from the solder bump formation resin composition. Then, the wiring board was immersed in 5 wt. % aqueous tetramethylammonium hydroxide at 50° C. for 10 minutes, to thereby remove the dry film and the thermoplastic resin component. Thereafter, solder bumps were visually observed.

"○": No corrosion observed on the bumps
"Δ": Slight corrosion (greenish copper corrosion product) observed around the bumps
"X": Complete corrosion (greenish copper corrosion product) observed around the bumps

TABLE 1

| Composition | Examples | | | | | | | | | | |
|---|---|---|---|---|---|---|---|---|---|---|---|
| | 1 | 2 | 3 | 4 | 5 | 6 | 7 | 8 | 9 | 10 | 11 |
| Resin | AA resin | AA resin | AA resin | AS resin | AS resin | AS resin | AS resin[4] | AS resin | AS resin[5] | AS resin[6] | AS resin[7] |
| Acid value (mgKOH/g) | 104 | 106 | 110 | 116 | 137 | 195 | 200 | 213 | 215 | 235 | 240 |
| Softening point (° C.) | 52 | 91 | 133 | 52 | 101 | 70 | 85 | 73 | 60 | 57 | 102 |
| Wt. av. mol. wt. | — | — | 20000 | — | — | 10000 | 8500 | 12500 | 3900 | 1600 | 15500 |
| (parts by mass) | 5.0 | 5.0 | 5.0 | 5.0 | 5.0 | 5.0 | 5.0 | 5.0 | 5.0 | 5.0 | 5.0 |
| Solvent[1] (parts by mass) | 5.0 | 5.0 | 5.0 | 5.0 | 5.0 | 5.0 | 5.0 | 5.0 | 5.0 | 5.0 | 5.0 |
| Solder powder[2] (parts by mass) | 90.0 | 90.0 | 90.0 | 90.0 | 90.0 | 90.0 | 90.0 | 90.0 | 90.0 | 90.0 | 90.0 |
| Activating agent[3] (parts by mass) | — | — | — | — | — | — | — | — | — | — | — |

TABLE 1-continued

| Composition | Examples | | | | | | | | | | |
|---|---|---|---|---|---|---|---|---|---|---|---|
| | 1 | 2 | 3 | 4 | 5 | 6 | 7 | 8 | 9 | 10 | 11 |
| Resist removability | ◯ | ◯ | ◯ | ◯ | ◯ | ◯ | ◯ | ◯ | ◯ | ◯ | ◯ |
| Solder bonding | ◯ | ◯ | ◯ | ◯ | ◯ | ◯ | ◯ | ◯ | ◯ | ◯ | ◯ |
| Resin removability | ◯ | ◯ | — | ◯ | ◯ | ◯ | ◯ | ◯ | ◯ | ◯ | ◯ |
| Solder subducting prevention | ◯ | ◯ | Δ | ◯ | ◯ | ◯ | ◯ | ◯ | ◯ | Δ | Δ |
| Handling | ◯ | ◯ | ◯ | ◯ | ◯ | ◯ | ◯ | ◯ | ◯ | ◯ | ◯ |
| Microparticle unification | ◯ | ◯ | Δ | ◯ | ◯ | ◯ | ◯ | ◯ | ◯ | ◯ | ◯ |
| Chargeability | — | — | Δ | — | — | ◯ | ◯ | ◯ | ◯ | ◯ | Δ |
| Anti-corrosion | ◯ | ◯ | ◯ | ◯ | ◯ | ◯ | ◯ | ◯ | ◯ | ◯ | ◯ |

TABLE 2

| Composition | Examples | | | | | | | Comp. Exs. | | | | |
|---|---|---|---|---|---|---|---|---|---|---|---|---|
| | 12 | 13 | 14 | 15 | 16 | 17 | 18 | 1 | 2 | 3 | 4 | 5 |
| Resin | MS resin | MS resin | MS resin | Rosin-modified resin[8] | Rosin-modified resin[9] | Rosin-modified resin[10] | Rosin-modified resin[11] | Polyester resin[12] | AA resin[13] | AS resin[14] | Rosin | AA resin |
| Acid value (mgKOH/g) | 196 | 213 | 285 | 135 | 150 | 200 | 240 | 0 | 74 | 108 | — | 104 |
| Softening point (° C.) | 83 | 77 | — | 130 | 90 | 140 | 130 | — | 65 | 60 | — | 52 |
| Wt. av. mol. wt. | 12000 | 12000 | — | 3000 | 3000 | 1000 | — | — | 10000 | 4600 | — | — |
| (parts by mass) | 5.0 | 5.0 | 5.0 | 5.0 | 5.0 | 5.0 | 5.0 | 5.0 | 5.0 | 5.0 | 5.0 | 4.5 |
| Solvent[1] (parts by mass) | 5.0 | 5.0 | 5.0 | 5.0 | 5.0 | 5.0 | 5.0 | 5.0 | 5.0 | 5.0 | 5.0 | 5.0 |
| Solder powder[2] (parts by mass) | 90.0 | 90.0 | 90.0 | 90.0 | 90.0 | 90.0 | 90.0 | 0.0 | 90.0 | 90.0 | 90.0 | 90.0 |
| Activating agent[3] (parts by mass) | — | — | — | — | — | — | — | — | — | — | — | 0.5 |
| Resist removability | ◯ | ◯ | ◯ | ◯ | ◯ | ◯ | ◯ | X | Δ | Δ | X | X |
| Solder bonding | ◯ | ◯ | ◯ | ◯ | ◯ | ◯ | ◯ | X | ◯ | ◯ | ◯ | ◯ |
| Resin removability | Δ | — | ◯ | Δ | ◯ | ◯ | ◯ | X | Δ | Δ | — | — |
| Solder subducting prevention | ◯ | ◯ | Δ | ◯ | ◯ | ◯ | Δ | ◯ | ◯ | ◯ | — | — |
| Handling | ◯ | ◯ | — | ◯ | ◯ | ◯ | ◯ | — | ◯ | ◯ | — | — |
| Microparticle unification | ◯ | ◯ | — | ◯ | ◯ | Δ | ◯ | — | ◯ | ◯ | — | — |
| Chargeability | ◯ | ◯ | — | — | — | ◯ | — | — | ◯ | ◯ | — | — |
| Anti-corrosion | ◯ | ◯ | ◯ | ◯ | ◯ | ◯ | ◯ | — | ◯ | ◯ | — | X |

AA resin: acrylic acid resin, AS resin: acrylic acid-styrene copolymer resin, MS resin: maleic acid-styrene copolymer resin
1) Arcosolve DPM (dipropylene glycol monoethyl ether, product of KH Neochem Co., Ltd.)
2) Pb-free solder powder (Sn 96.5 wt. %, Cu 3.0 wt. %, Ag 0.5 wt. %, av. particle size: 5 μm)
3) Diethylamine HBr salt
4) Arufon UC-3910 (product of TOAGOSEI Co., Ltd.)
5) JONCRYL 680 (product of BASF)
6) JONCRYL 682 (product of BASF)
7) Arufon UC-3920 (product of TOAGOSEI Co., Ltd.)
8) Hariester MSR-4 (maleic acid-modified rosin, product of Harima Chemicals group, Inc.)
9) HARITACK FG-90 (product of Harima Chemicals group, Inc.)
10) Malkyd 31 (maleated rosin, product of Arakawa Chemical Industries, Ltd.)
11) Pale color rosin KE-604 (acid-modified ultra-pale color hydrogenated rosin, product of Arakawa Chemical Industries, Ltd.)
12) Vylon GK-250 (aromatic polyester resin, product of TOYOBO Co., Ltd.)
13) Arufon UC-3000 (product of TOAGOSEI Co., Ltd.)
14) Arufon UC-3900 (product of TOAGOSEI Co., Ltd.)

As is clear from Tables, the following results were obtained.

When an alkali-dissoluble resin was used, excellent basic properties (resist removability and solder bonding performance) were attained, regardless of the structure of the resin (Examples 1 to 18). In contrast, when an alkali-non-dissoluble resin was used, excellent basic properties were not attained (Comparative Example 1).

Figure 4A:
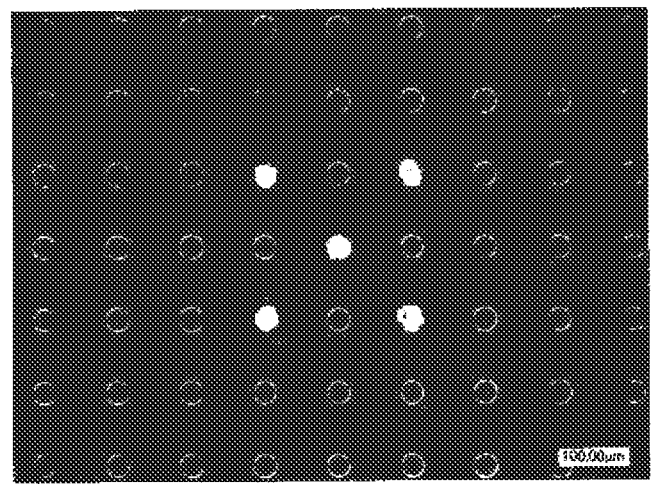
FIG. 4A is a photograph showing a solder-mounted board of Example 15 after reflowing.
Figure 4B:
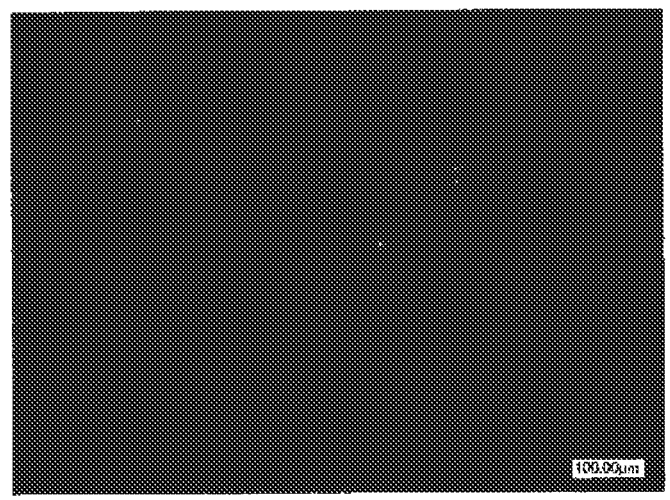
FIG. 4B is a photograph of the same board after removal of dry film.
Figure 5A:
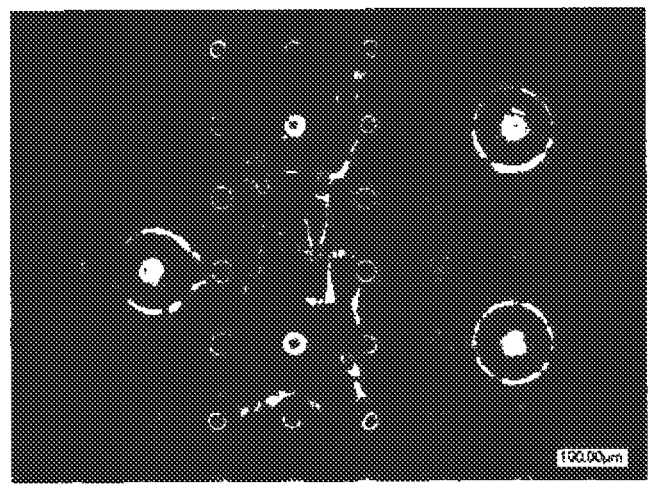
FIG. 5A is a photograph showing a solder-mounted board of Comparative Example 3 after reflowing.
Figure 5B:
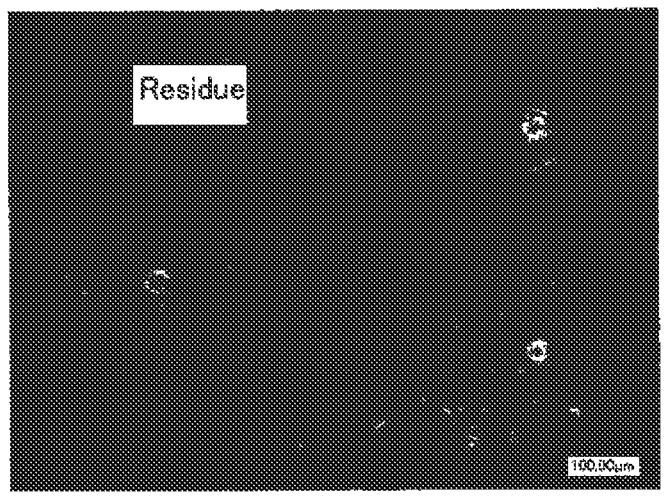
FIG. 5B is a photograph of the same board after removal of dry film.

When the alkali-dissoluble resin has an acid value equal to or higher than a predetermined value, excellent resist removability was attained (Examples 1 to 18). FIG. 4A is a photograph of a solder-mounted board of Example 15 after reflowing, and FIG. 4B is a photograph of the same board after removal of dry film. As shown in the photographs, when the resin has an acid value equal to or higher than a predetermined value, no residue was observed after removal of dry film. In contrast, when the alkali-dissoluble resin has an acid value lower than a predetermined value, excellent resist removability was not attained (Comparative Examples 2 and 3). FIG. 5A is a photograph of a solder-mounted board of Comparative Example 3 after reflowing, and FIG. 5B is a photograph of the same board after removal of dry film. As shown in the photographs, when the alkali-dissoluble resin has an acid value lower than a predetermined value, a residue was observed after removal of dry film.

When rosin or an activating agent was used, favorable resist removability was not attained (Comparative Examples 4 and 5).

Figure 6A:
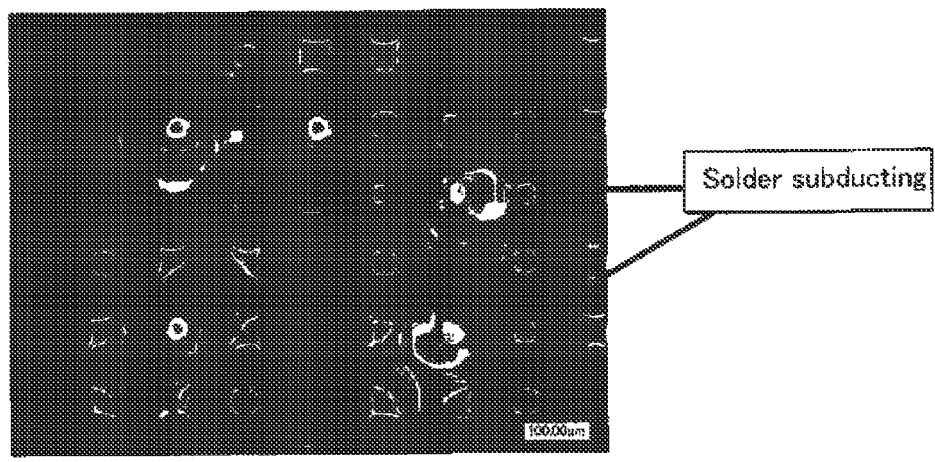
FIG. 6A is a photograph showing a solder-mounted board of Example 10 after reflowing.
Figure 6B:
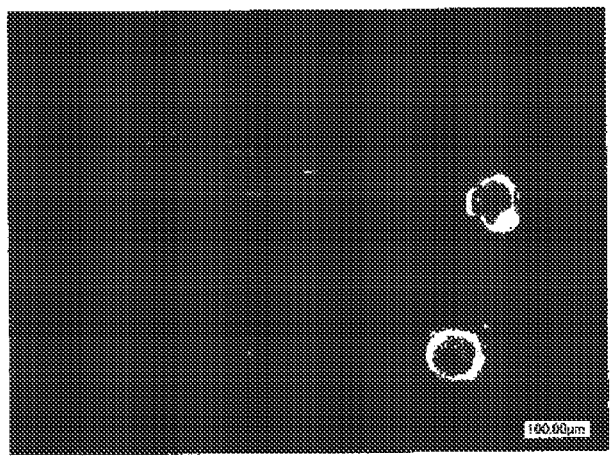
FIG. 6B is a photograph of the same board after removal of dry film.

When the resin component of the alkali-dissoluble resin has an excessively high acid value (Examples 3, 10, 11, 14, and 18), adhesion of dry film was found to decrease, thereby causing subducting of solder to a space under the dry film. FIG. 6A is a photograph showing a solder-mounted board of Example 10 after reflowing, and FIG. 6B is a photograph of the same board after removal of dry film. As shown in FIGS. 6A and 6B, when, for example, AS resin has an excessively high acid value (Examples 10 and 11), solder subducting was observed after reflowing and removal of dry film. In contrast, when the resin component of the alkali-dissoluble resin has an acid value not excessively high (Examples other than the above-mentioned Examples), as shown in FIG. 4, adhesion of dry film was not impaired at all, and no solder subducting was observed under the dry film. In this case, excellent solder bumps were found to be formed.

What is claimed is:

1. A solder bump formation method which comprises:
    using a solder bump formation resin composition containing (A) an alkali-soluble thermoplastic resin which is a solid at ambient temperature, (B) a solvent, and (C) a solder powder, the solder bump formation resin composition containing no activating agent,
    the component (A) being at least one species selected from among the group consisting of i) an unsaturated fatty acid polymer having an acid value of 80 to 110 mgKOH/g, ii) a monobasic unsaturated fatty acid-aromatic unsaturated compound copolymer having an acid value of 110 to 220 mgKOH/g, iii) a dibasic unsaturated fatty acid-aromatic unsaturated compound copolymer having an acid value of 200 to 215 mgKOH/g, and iv) a rosin-modified resin having an acid value of 140 to 220 mgKOH/g,
    the rosin-modified resin being at least one species selected from the group consisting of i) a rosin-modified resin prepared through adding a dibasic unsaturated fatty acid to rosin, adding a polyhydric alcohol thereto, and carrying out esterification at high temperature, ii) a rosin-modified phenolic resin, and iii) a rosin POE ester product;
    placing a resist layer provided with an opening on a member having a pad such that the pad is exposed to the opening;
    filling the opening with the solder bump formation resin composition;
    removing the component (B);
    melting the component (C) by heating; and
    removing the resist layer and the component (A).

2. A member having a solder bump formed through the solder bump formation method as recited in claim 1.

3. A solder bump formation resin composition, which is used in the solder bump formation method as recited in claim 1,
    wherein the solder bump formation resin composition contains (A) an alkali-soluble thermoplastic resin which is a solid at ambient temperature, (B) a solvent, and (C) a solder powder, and containing no activation went,
    wherein the component (A) is at least one species selected from among the group consisting of
    i) an unsaturated fatty acid polymer having an acid value of 80 to 110 mgKOH/g,
    ii) a monobasic unsaturated fatty acid-aromatic unsaturated compound copolymer having an acid value of 110 to 220 mgKOH/g,
    iii) a dibasic unsaturated fatty acid-aromatic unsaturated compound copolymer having an acid value of 200 to 215 mgKOH/g, and
    iv) a rosin modified resin having an acid value of 140 to 220 mgKOH/g, and
    wherein the rosin-modified resin is at least one species selected from the group consisting of i) a rosin-modified resin prepared through adding a dibasic unsaturated fatty acid to rosin, adding a polyhydric alcohol thereto, and carrying out esterification at high temperature, ii) a rosin-modified phenolic resin, and iii) a rosin POE ester product.

* * * * *